United States Patent [19]

Gotou

[11] Patent Number: 5,120,666

[45] Date of Patent: Jun. 9, 1992

[54] MANUFACTURING METHOD FOR SEMICONDUCTOR DEVICE

[75] Inventor: Hiroshi Gotou, Niiza, Japan

[73] Assignee: Fujitsu Limited, Kanagawa, Japan

[21] Appl. No.: 523,679

[22] Filed: May 2, 1990

[30] Foreign Application Priority Data

May 16, 1989 [JP] Japan .................. 1-122451

[51] Int. Cl.⁵ .......................... H01L 21/265
[52] U.S. Cl. .......................... 437/40; 437/62; 437/43; 437/78; 437/203; 437/90; 148/DIG. 150; 148/DIG. 164
[58] Field of Search ........ 437/21, 62, 40, 43, 437/78, 235, 203, 90; 148/DIG. 150, DIG. 164

[56] References Cited

U.S. PATENT DOCUMENTS

| 4,649,627 | 3/1987 | Abernathey et al. | 448/DIG. 150 |
| 4,692,994 | 9/1987 | Moniwa et al. | 148/DIG. 150 |
| 4,774,196 | 9/1988 | Blanchard | 148/DIG. 150 |
| 4,888,300 | 12/1989 | Burton | 437/62 |

FOREIGN PATENT DOCUMENTS 0265469 11/1988 Japan.

Primary Examiner—Olik Chaudhuri
Assistant Examiner—Trung Dang
Attorney, Agent, or Firm—Armstrong, Nikaido, Marmelstein, Kubovcik & Murray

[57] ABSTRACT

In the manufacture of MISFETs using an Si layer island having an SOI structure, the present invention provides an Si layer over an $SiO_2$ insulation layer, having a groove passing underneath the Si layer gate region and being formed on the surface of the $SiO_2$ insulation layer by side etching conducted from both sides of the Si layer gate region, so as to form the source and drain. Next, after the $SiO_2$ insulation layer is formed on the exposed surface of the Si layer gate electrode, a doped polysilicon region is formed through the $SiO_2$ insulation film in such a manner that the groove and the area surrounding the Si layer gate region are filled, thereby forming the gate electrode. Thereafter, the MISFET is completed according to ordinary FET manufacturing methods.

16 Claims, 8 Drawing Sheets

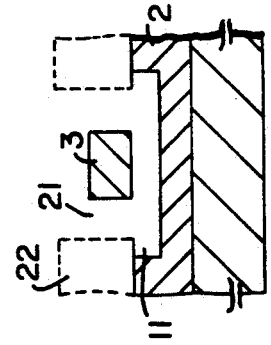
FIG.3(Ac)
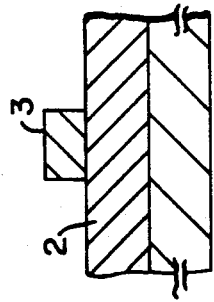
FIG.3(Ab)
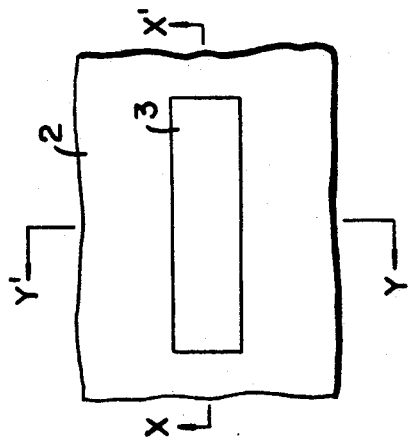
FIG.3(Aa)
FIG.3(Bc)
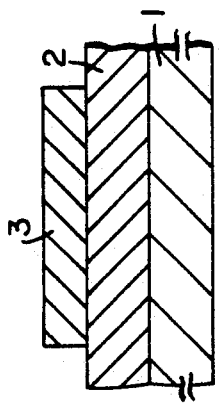
FIG.3(Bb)
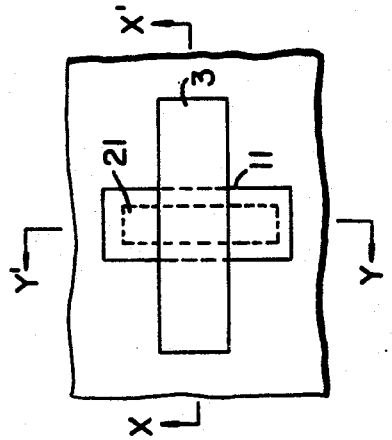
FIG.3(Ba)

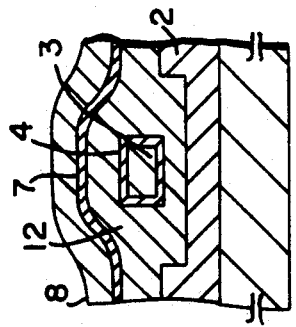
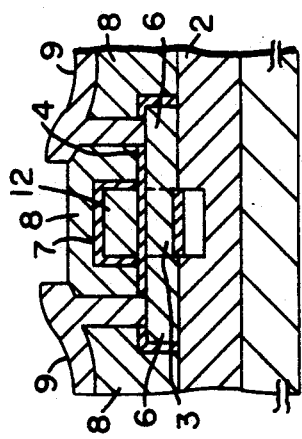
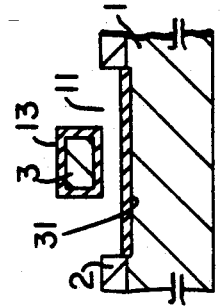
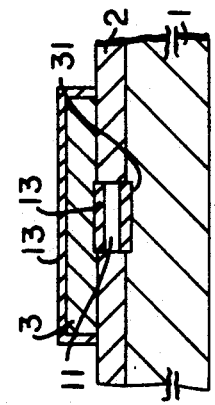
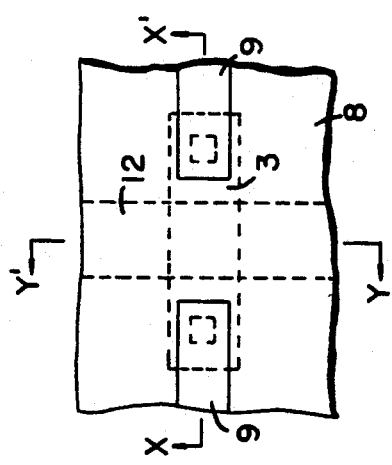
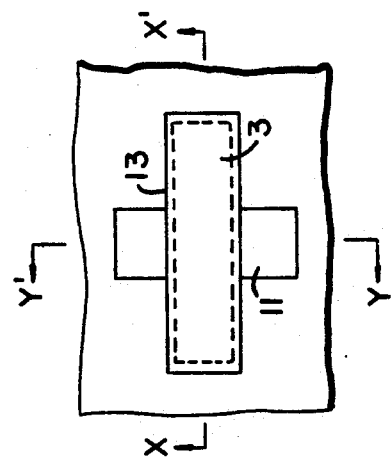

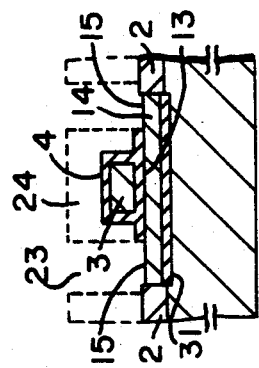
FIG.4(Dc)
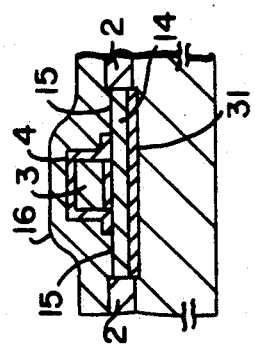
FIG.4(Ec)
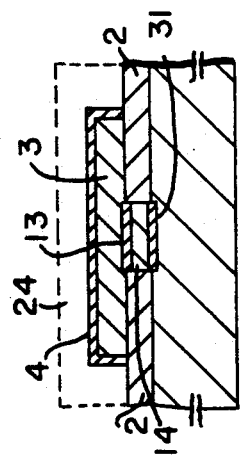
FIG.4(Db)
FIG.4(Eb)
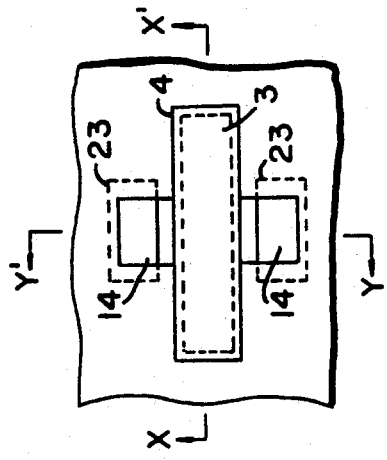
FIG.4(Da)
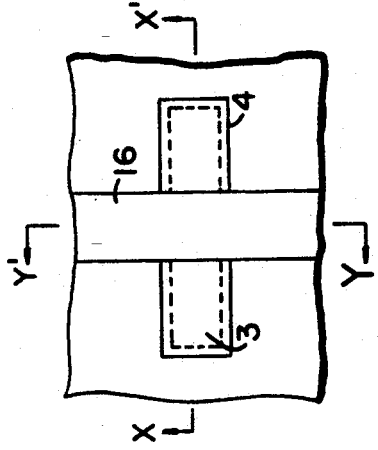
FIG.4(Ea)

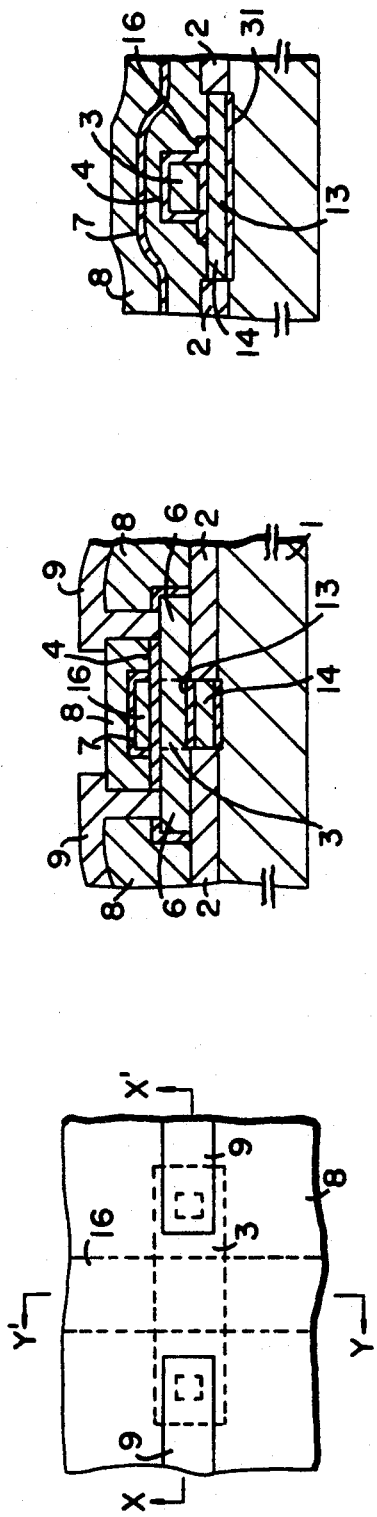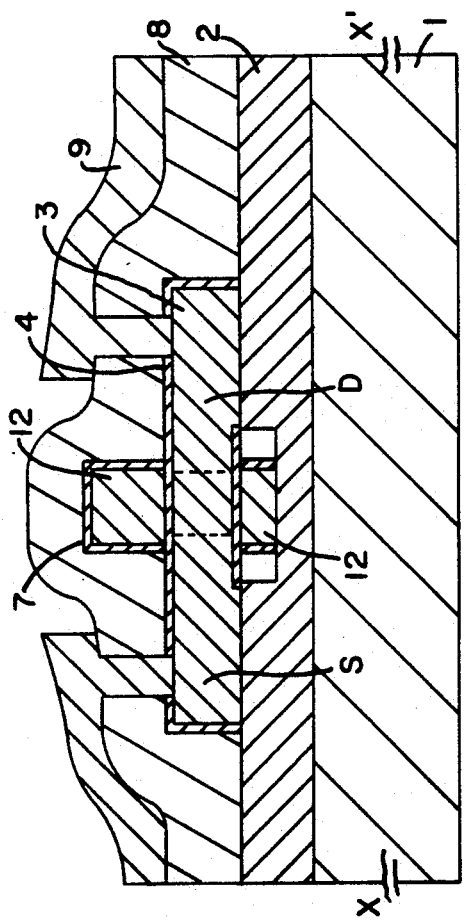

MANUFACTURING METHOD FOR SEMICONDUCTOR DEVICE

BACKGROUND OF THE INVENTION

1. Field of the invention

The present invention relates to a manufacturing method for semiconductor devices and more particularly to a method for forming a Field Effect Transistor (FET) on an SOI layer.

Methods for forming semiconductor devices on SOI layers are essential for improving the isolation characteristics of devices and also for allowing plural layers of semiconductor devices to be stacked atop each other.

Recently, shallow device regions have been formed, in order to realize a high speed operation of the device itself.

Semiconductor devices are typically formed on a device substrate (SOI layer) using, for example, an SOI (Silicon On Insulator) substrate which is formed by stacking thin device substrates on a thick substrate through a very thin oxide film.

In the case where an FET is formed on an SOI layer as a semiconductor device, the characteristics of a semiconductor layer, the insulation film on which the semiconductor layer is formed, and the characteristics of the interface between the semiconductor layer and the insulation film all importantly influence the characteristics of the FET. Accordingly, in order to improve the characteristics of an FET formed on an SOI layer, it is strongly advisable to improve the characteristics of the semiconductor layer and insulation film themselves, as well as the characteristics of the interface between the semiconductor layer and the insulation film.

2. Description of the Related Art

A schematic sectional view of an FET formed on an SOI film by conventional methods is shown in FIG. 1.

In FIG. 1, numeral 2 designates an insulation layer formed on a substrate 1. A semiconductor layer 3, isolated like an island, is formed on the insulation layer 2 (i.e. an isolated SOI layer) on which the FET is formed. A gate insulation film 4 covers the semiconductor layer 3. A gate electrode 5 is provided on the gate insulation film 4, and a source/drain region 6 is formed in the semiconductor layer 3. An insulation film 7 is formed on the surface of the gate electrode 5. Numeral 9 designates a metal wiring.

The above-described FET is formed by the following process: A semiconductor layer 3, isolated like an island, is formed by patterning a semiconductor layer (SOI layer) on the insulation layer 2. A gate insulation film 4 is formed on its surface, and thereafter a gate electrode film is deposited over the entire surface thereof and a gate electrode 5 is formed by patterning such a gate electrode film. Next, a source/drain region 6 is formed by selectively implanting ions within the island of the semiconductor layer 3. Thereafter an insulation film 7 is formed on the surface of gate electrode 5. However, selective ion implantation as described above, may also be conducted after formation of the insulation film 7.

As possible methods for forming the SOI substrate, for example, SIMOX wafer bonding SOI, and laser anneal single crystallization can be considered. Among these, in the SIMOX method, oxygen ions are implanted before hand to a comparatively deep area from the surface of a single silicon wafer by activating implanted oxygen through heating of the substrate, and the upper silicon layer partitioned by such an oxide layer is used as the element region. However, it is very difficult to form a high quality device region using this method. In addition, it has been proposed that a silicon layer be formed by chemical vapor deposition (CVD) on the surface of a supporting substrate comprising a silicon wafer, and this silicon layer is then melted once by laser annealing and then recrystallized. A single crystal silicon layer thus formed is used as the device region. However, it is also difficult, in this case, to form a high quality device region. Therefore, wafer bonding SOI has recently attracted much attention as a promising method for manufacturing an SOI substrate on which a high quality device region may be formed. In this method, two sheets of silicon wafers are prepared, an oxide film is formed on at least one of them, another silicon wafer is put on the surface of the oxide film, and the wafers are bonded, for example, by electrostatic bonding followed by annealing. Thereafter, the surface of one of the silicon wafers is ground, and the layer being left as a thin layer is used as the device region.

However, even when a wafer bonding SOI method is employed to form a high quality SOI substrate as the device region, it is difficult to form a device region (i.e. the isolated semiconductor layer 3) thinner than about 1 $\mu$m, because even when the silicon wafer is simply polished, the surface of the silicon substrate itself is currently not so flat that it can be formed with a thickness of 1 $\mu$m. It is also difficult, from a technical viewpoint, to uniformly polish the silicon substrate surface up to a thickness of 1 $\mu$m or less. It is also difficult, even by other SOI methods, to form the isolated semiconductor layer 3 conforming to design values having a thickness of 1 $\mu$m or less, due to an excessively small process margin.

Accordingly, in a MOSFET which has been manufactured by the method described above, using such a wafer bonded SOI substrate, the drain current—voltage characteristics of the MOSFET, when the thickness of the semiconductor layer island 3 is formed to be about 1 $\mu$m for easy manufacture, exhibits a so-called "kink" phenomenon in which the drain current suddenly increases as shown in FIG. 2 whenever a certain drain voltage is exceeded. Therefore, the circuit operations become unstable due to overshooting of the output voltage in AC operation of a source follower circuit.

It is known, however that such a kink phenomenon does not appear when the thickness of semiconductor layer island 3 is thin, i.e. about 0.1 $\mu$m. However, formation of the thin SOI layer needed in order to produce such a thin semiconductor island 3 is always accompanied by technical difficulty.

Japanese Patent Laid-open No. 63-265469 discloses the following: Since a current flowing from the side or bottom surfaces of the Si layer island causes a subthreshold current in the FET, a structure for surrounding the area between the source and drain of the Si layer island with a doped polysilicon layer has been proposed in order to eliminate such a current. The polysilicon layer serves as a gate electrode through the $SiO_2$ film. However, the structure disclosed by this method is formed by a process wherein the Si layer on which FET is formed is recrystallized in an area between the source and drain first by melting the Si layer and thereafter recrystallizing the Si layer with laser irradiation. Accordingly, an $SiO_2$ film provided underneath the Si layer island is subjected to damage due to high temperatures in the recrystallization process. Therefore, in order to prevent such damage, the SiO$_2$ layer is required to have a constant thickness, sufficiently resistive to such high temperatures. In other words, according to this method, the thickness of the gate oxide film cannot be controlled to a constant value or less. Accordingly, this method is not a practical method for forming an FET using SOI.

SUMMARY OF THE INVENTION

It is an object of the present invention to manufacture an FET using an SOI layer having a thickness of about 1 μm and being easy to form while avoiding the problem of kink phenomenon in the drain current-voltage characteristics thereof.

A further object of the present invention is to provide a method for manufacturing an FET by forming a semiconductor layer island by patterning a semiconductor layer on an insulation layer on the surface of a semiconductor substrate;

forming grooves by etching the insulation layer on both sides of a center area of the semiconductor layer island, so that each of the grooves extends under the semiconductor island closely to each other, or perfectly joined to each other, and wherein the semiconductor layer island has an exposed surface on the semiconductor substrate at the bottom thereof where the etching depth is largest;

forming an insulation film on the exposed surface of the semiconductor layer island including the grooves; and forming a gate electrode by patterning a conductive film so as to pass opposing the grooves on the semiconductor layer island and being formed integrally with a part filling the grooves, the conductive film being deposited by filling the grooves and covering an entire surface of the semiconductor layer island. A still further object of the present invention is to provide a method for manufacturing an FET by forming a semiconductor layer island by patterning a semiconductor layer on an insulation layer;

forming grooves by etching the insulation layer from both sides of a center area of the semiconductor layer island, so that each of the grooves extends under the semiconductor island closely to each other, or perfectly joined to each other, and wherein the semiconductor layer island has an exposed surface on the semiconductor substrate at the bottom thereof where the etching depth is largest;

forming a first insulation film on the exposed surface of the semiconductor layer island including the grooves;

forming a conductive electrode filing the grooves;

forming a second insulation film having a contact window on the electrode at the exposed surface of the semiconductor layer island and the electrode after removing an exposed area of the first insulation film; and forming a gate electrode by patterning a conductive film so as to pass opposing the grooves on the semiconductor layer island and being formed integrally with a part filling the grooves, the conductive film being deposited and covering an entire part of the semiconductor layer island filling the contact window.

The kink phenomenon exhibited in the drain current-voltage characteristics of an FET formed on an SOI layer is believed to be generated because the interface and periphery of the semiconductor layer island, comprising an insulation layer underneath the gate electrode, is not depleted. According to the present invention, the interface and periphery between the semiconductor layer island and the insulation film is surely depleted, even when the thickness of the semiconductor layer island is about 1 μm, by disposing the gate electrode so as to surround the area between the source and drain of the semiconductor layer island. Accordingly, the kink phenomenon occurring in the drain current-voltage characteristics of conventional FET's formed on an SOI layer is no longer generated in the present invention. Therefore, unstable operation of the circuit due to overshooting during AC operation thereof can be eliminated.

BRIEF DESCRIPTION OF THE DRAWINGS

The above and other objects and the attendant advantages of the present invention will become readily apparent by reference to the following detailed description when considered in conjunction with the accompanying drawings wherein:

FIG. 3(Ab) is a sectional view along the line X—X' of FIG. 3(Aa);

FIG. 3(Ac) is a sectional view along the line Y—Y' of FIG. 3(Aa);

FIG. 3(Ba) is a plan view schematically indicating a process for forming a groove passing underneath the center area of an Si layer island;

FIG. 3(Bb) is a sectional view along the line X—X' of FIG. 3(Ba);

FIG. 3(Bc) is a sectional view along the line Y—Y' of FIG. 3(Bc);

FIG. 3(Ca) is a plan view schematically indicating a process for forming a gate oxide film;

FIG. 3(Cb) is a sectional view along the line X—X' of FIG. 3(Ca);

FIG. 3(Cc) is a sectional view along the line Y—Y' of FIG. 3(Ca);

FIG. 3(Da) is a plan view sohematically indicating a process for forming a polysilicon gate electrode;

FIG. 3(Db) is a sectional view along the line X—X' of FIG. 3(Da);

FIG. 3(Dc) is a sectional view along the line Y—Y' of FIG. 3(Da);

FIG. 3(Ea) is a plan view schematically indicating a process for completing an FET by forming a source/drain region, interlayer insulation film, and metal wiring thereof;

FIG. 3 (Eb) is a sectional view along the line X—X' of FIG. 3(Ea);

FIG. 3(Ec) is a sectional view along the line Y—Y' of FIG. 3(Ea);

FIG. 4(Ab) is a sectional view along the line X—X' of FIG. 4(Aa);

FIG. 4(Ac) is a sectional view along the line Y—Y' of FIG. 4(Aa);

FIG. 4(Ba) is a plan view schematically indicating a process for forming a first insulation film on the Si layer island;

FIG. 4(Bb) is a sectional view along the line X—X' of FIG. 4(Ba);

FIG. 4(Bc) is a sectional view along the line Y—Y' of FIG. 4(Ba);

FIG. 4(Ca) is a plan view schematically indicating a process for forming a polysilicon gate electrode passing underneath the center area of an Si layer island;

FIG. 4(Cb) is a sectional view along the line X—X' of FIG. 4(Ca);

FIG. 4(Cc) is a sectional view along the line Y—Y' of FIG. 4(Ca);

FIG. 4(Da) is a plan view schematically indicating a process for forming a contact hole, serving as a source and drain, by forming a gate oxide film on an Si layer island;

FIG. 4(Db) is a sectional view along the line X—X' of FIG. 4(Da);

FIG. 4(Dc) is a sectional view along the line Y—Y' of FIG. 4(Da);

FIG. 4(Ea) is a plan view schematically indicating a process for forming a polysilicon gate electrode passing on the center area of an Si layer island;

FIG. 4(Eb) is a sectional view along the line X—X' of FIG. 4(Ea);

FIG. 4(Ec) is a sectional view along the line Y—Y' of FIG. 4(Ea);

FIG. 4(Fa) is a plan view schematically indicating a process for completing an FET by forming a source/drain region, interlayer insulation film, and metal wiring;

FIG. 4(Fb) is a sectional view along the line Y—Y' of FIG. 4(Fa);

FIG. 4(Fc) is a sectional view along the line Y—Y' of FIG. 4(Fa);

FIG. 5b is a sectional view along the line X—X' of FIG. 5a; and

FIG. 5c is a sectional view along the line Y—Y' of FIG. 5a.

DESCRIPTION OF THE PREFERRED EMBODIMENTS

Figure 1:
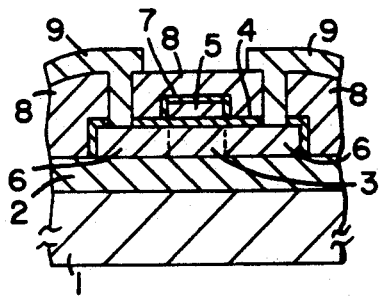
FIG. 1 is a schematic sectional view of an FET manufactured on an SOI layer according to conventional manufacturing methods.
Figure 2:
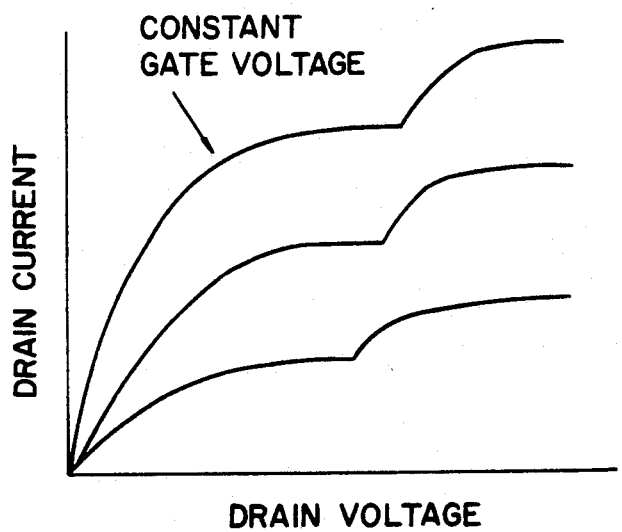
FIG. 2 shows the drain current—voltage characteristics of the FET shown in FIG. 1.
Figure 3:
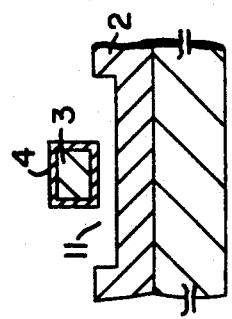
FIG. 3(Aa) is a plan view schematically indicating a first condition of the process for manufacturing an FET using SOI, according to the first embodiment of the present invention.
Figure 3:
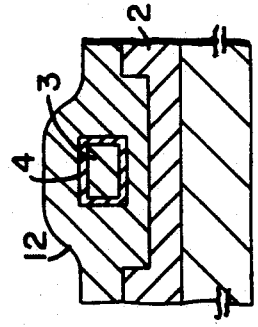
Figure 3:
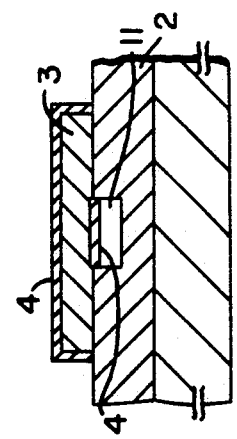
Figure 3:
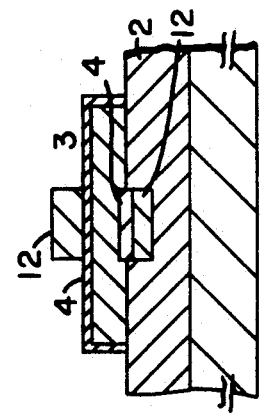
Figure 3:
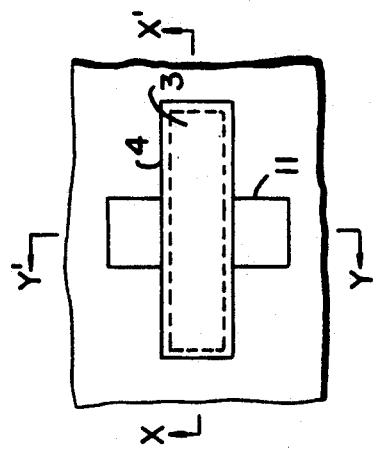
Figure 3:
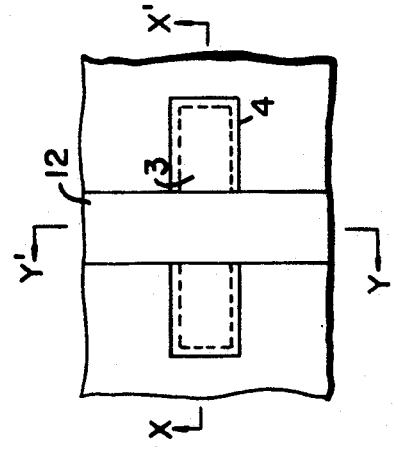
Figure 4:
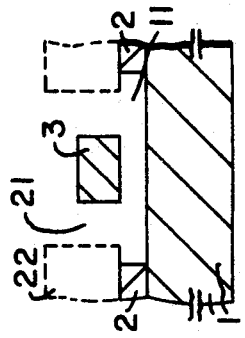
FIG. 4(Aa) is a plan view schematically indicating a process for forming a groove passing underneath the center area of an Si layer island, according to the second embodiment of the present invention.
Figure 4:
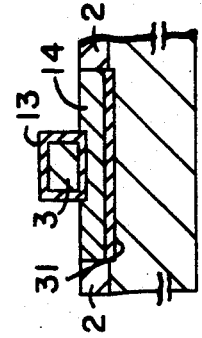
Figure 4:
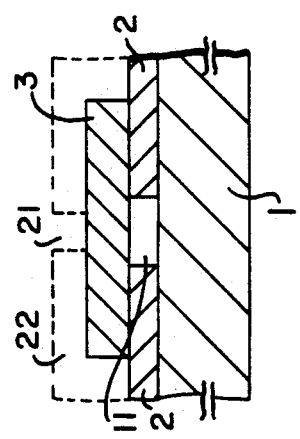
Figure 4:
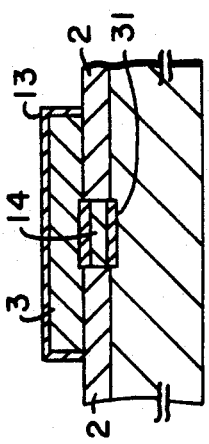
Figure 4:
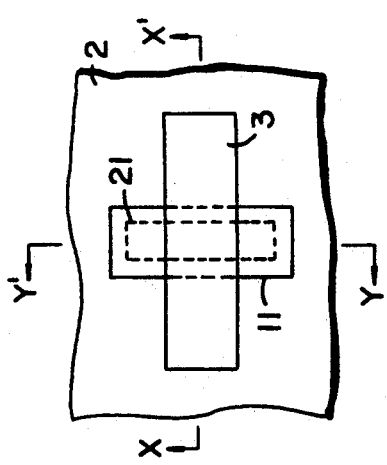
Figure 4:
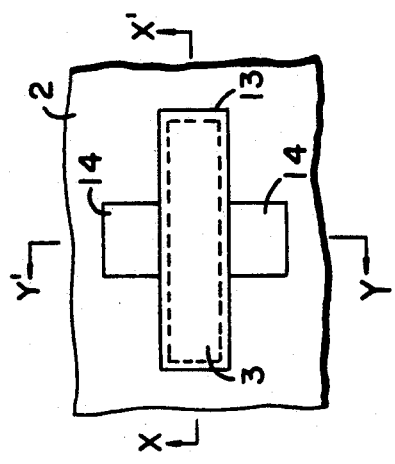

Embodiments of the present invention will be explained first with reference to FIGS. 3(Aa) to FIG. 4(Fc). FIGS. 3(Aa)–3(Ec) are plan and sectional views indicating a process according to the first embodiment of the invention. FIGS. 4(Aa)–4(Fc) are plan and sectional views indicating a process according to the second embodiment of the invention. Capital letters appearing in parentheses indicate each step, a small letter "a" indicates a plan view, and small letters "b" and "c" indicate sectional views respectively. Like numerals shall designate like elements throughout the drawings.

First Embodiment

FIGS. 3(Aa), 3(Ab), and 3(Ac) indicate the initial conditions 1 of the process. FIG. 3(Ab) is a sectional view along the line X—X' of FIG. 3(Aa) and FIG. 3(Ac) is a sectional view along the line Y—Y' of FIG. 3(Aa).

In the SOI structure, as shown in FIG. 3(Ab) an Si layer 3 (SOI layer) is provided on an Si oxide film ($SiO_2$ film) 2 formed on the surface of an Si substrate 1. According to this embodiment of the present invention, the SOI structure is prepared by a wafer bonding method, as described below.

In such a wafer bonding method, two Si wafers having a resistivity of 10 ohm/cm, for instance, are prepared, an $SiO_2$ film of 2 $\mu$m is formed on the surface of one wafer, and the surface of the other wafer is placed thereon. Annealing is carried out for one hour, for example, in a nitrogen gas atmosphere, and an Si layer (SOI layer) is obtained by thinning the top surface. Alternatively, the $SiO_2$ films are put face to face with each other. Then, ion implantation of boron is performed, at an energy of 100 KeV and a dosage of $1 \times 10^{12}$ cm$^{-2}$ in order to control the threshold voltage.

A rectangular Si layer island 3 is formed by patterning the SOI layer. Only one FET is formed on the Si layer island 3. The thickness of the $SiO_2$ film is 2 $\mu$m, the thickness of the Si layer island 3 is 1 $\mu$m, and the length of the short side thereof (i.e. the gate width direction) is 1 $\mu$m.

Thereafter, as shown in FIGS. 3(Ba), 3(Bc), a uniform resist film 22 is provided having a rectangular etching window 21 formed therein by photolitography so as to bridge over the center area of the Si layer island 3. The etching window 21 has dimensions of 1 $\mu$m in the gate length direction and 3 $\mu$m in the gate width direction.

The exposed insulation layer 2 is etched using hydrofluoric acid with the resist film 22 serving as a mask. Thereby, side etching proceeds from the center areas of both sides of the Si layer island 3, and a groove 11 is formed wherein the Si layer island 3 becomes a bridge provided thereover. The width of the groove is about 2 $\mu$m and the depth is about 0.5 $\mu$m. The corners of the Si layer island can be rounded using an isotropic etching technique, or a rounding oxidation technique, at a temperature higher than about 1100° C. in a dry atmosphere, in order to effectively reduce the subthreshold leakage current.

Next, as shown in FIGS. 3(Ca), 3(Cb), and 3(Cc), the resist film 22 is removed and an $SiO_2$ film 4 having a thickness of about 300Å is formed by dry oxidation on the exposed surface of the Si layer island 3, including the under surface of the bridge formed over the groove 11 in the $SiO_2$ film layer. This film is used as a gate insulation film 4.

Thereafter, as shown in FIGS. 3(Da), 3(Db), and 3(Dc), a conductor film consisting of doped polysilicon having a thickness of about 0.7 $\mu$m is deposited by CVD (chemical vapor deposition), filling and covering the entire part of the groove 11, thus forming a gate electrode 12 by patterning the conductive film, which is opposed to the groove 11, and is integral with the part filling the groove 11 and which passes over the Si layer island 3. The gate length of the gate electrode 12 is about 2 $\mu$m.

Finally, a source/drain region 6 is formed by selective ion implantation, for instance, with arsenic ions having an energy 100 KeV and a dosage of $1 \times 10^{15}$ cm$^{-2}$, thereby conforming to ordinary FET manufacturing processes. An $SiO_2$ insulation film 7 is formed to a thickness of about 500Å by dry oxidation, and a PSG layer inter-insulation film 8 and metal wiring 9 are formed, thus completing the FET. The completed FET is shown in FIGS. 3(Ea), 3(Eb), and 3(Ec).

The drain current voltage characteristics of the FET according to the first embodiment do not exhibit a kink phenomenon. Furthermore, no overshoot in the output voltage from a source follower circuit is generated during the AC operation thereof.

Second Embodiment

FIGS. 4(Aa), 4(Ab), and 4(Ac) show the initial conditions of a process according to the second embodiment. FIG. 4(Ab) is a sectional view along the line X—X' of FIG. 4(Aa), and FIG. 4(Ac) is a sectional view along the line Y—Y' of FIG. 4(Aa).

Like the first embodiment, the Si layer island 3 and groove 11 are formed from the SOI layer.

However, unlike the first embodiment, the thickness of the $SiO_2$ film 2 is about 1 μm, which is a half of that of first embodiment. The thickness of the Si layer island 3 is about 1 μm and the length in the gate width direction is about 2 μm. The size of the etching window 21 in the gate length direction is about 1 μm, while the groove 11 is formed from both sides of the center area of the Si layer island 3 to a depth of about 1 μm, and having a length in the gate width direction of about 3 μm. Since the thickness of $SiO_2$ film 2 is 1 μm, the substrate 1 is exposed at the bottom surface of groove 11.

Thereafter, as shown in FIGS. 4(Ba), 4(Bb), and 4(Bc), an $SiO_2$ film 13 (i.e. a first $SiO_2$ film) is formed to a thickness of 300Å on all exposed surfaces, including the part of the Si layer island 3 bridging over the groove 11, by dry oxidation. Simultaneously, an $SiO_2$ film 31 is also formed on the exposed surface (i.e. the bottom surface of groove 11) of the substrate 1.

Next, as shown in FIGS. 4(Ca), 4(Cb), and 4(Cc), a conductive film consisting of doped polysilicon is deposited by CVD to a thickness of about 2 μm, so that the surface of the groove 11 on both sides of Si layer island 3 becomes filled, thereby covering the entire part of groove 11 so as to be almost flush with the film layer 2.

Thereafter, the part other than the inside of groove 11 is etched back to form an electrode 14 filling the groove 11. This electrode 14 is insulated from the substrate 1 on account of the $SiO_2$ film 31 already formed over the exposed substrate 1, as shown in FIG. 4(Bc). Doping of the polysilicon film can also be conducted by ion implantation/annealing in a stage proceeding the etch back step. Such ion implantation is carried out with phosphorus ions having an energy of 50 KeV and dosage of $1 \times 10^{16}$ cm$^{-2}$ for instance.

Next, as shown in FIGS. 4(Da), 4(Db), and 4(Dc), after the exposed part 23 of the $SiO_2$ film 43, having a size of $1.5 \times 1.0$ μm$^2$ for example, is removed, a second $SiO_2$ film is newly formed to a thickness of about 300Å by dry oxidation on the exposed surfaces of the Si layer island 3 and electrode 14, thereby forming a gate oxide film 4 on the exposed part of the Si layer island 3. The second $SiO_2$ film 4 is formed because the oxide film 13 becomes damaged at the time of etching back the polysilicon in the proceeding process step. Next, a resist film 24 is provided on the entire surface and an etching window 23 is formed over the electrode 14. The portion of the $SiO_2$ film covering the electrode 14 is removed using hydrofluoric acid, thereby forming a contact hole 15 for the electrode 14. Thereafter, as shown in FIGS. 4(Ea), 4(Eb), and 4(Ec), the resist film 24 is removed and a conductive film consisting of doped polysilicon is deposited by CVD to a thickness of about 0.4 μm over the entire surface and filling the contact hole 15. The conductive film is patterned to form a gate electrode 16 of 3 μm in the gate length direction which passes over the Si layer island 3 opposing the electrode 14, and which becomes integrated with the electrode 14. In place of using doped polysilicon, selective ion implantation of impurities may be conducted prior to the patterning of the polysilicon.

Finally, the FET is completed by forming the source/drain region 6 by selective ion implantation, forming an $SiO_2$ film 7 to a thickness of 500Å by dry oxidation, and forming a PSG (Phospho Silicate Glass) interlayer insulation film 8 and metal wiring 9, according to ordinary FET manufacturing processes.

The FET manufactured by the above described method also shows drain current—voltage characteristics having no kink phenomenon, and therefore also shows an output voltage characteristic having no overshoot during AC operation thereof in a source follower circuit.

In the second embodiment, the part corresponding to the gate electrode 12 in the first embodiment is formed individually for the electrode 14 and gate electrode 16. Accordingly, the process is slightly more complicated than the first embodiment. However, the gate electrode 16 on the Si layer island 3 can be formed thinner than the gate electrode 12 of the first embodiment. Accordingly, the second embodiment provides an advantage in that the difference between protruded and recessed portions can be made smaller than in the first embodiment. In the first and second embodiments, no kink phenomenon is generated in the drain current—voltage characteristics thereof, because the region of the Si layer island 3 near the interface between the Si layer island 3 and the insulation layer 2 is depleted due to the fact that the electrode filling the groove 11 is disposed underneath the Si layer island 3 as described above. Since the depletion spreads not only in a vertical direction but also in a lateral direction, an effect similar to that obtained when the groove 11 is formed through and under the Si layer island 3 can be attained, when depletion in the lateral direction is sufficient, even in the event that the groove 11 is formed closely under the Si layer island 3 from both sides thereof, but wherein the groove is not formed completely therethrough. Since a groove having such a structure may be formed with less side etching to the area underneath the Si layer island 3 from both sides thereof, this structure is effective for manufacturing an FET having a short gate length.

The second embodiment results in an exposed substrate 1 at the bottom surface of groove 11 when the groove 11 is completed, but this structure need not be essential.

Figure 5A:
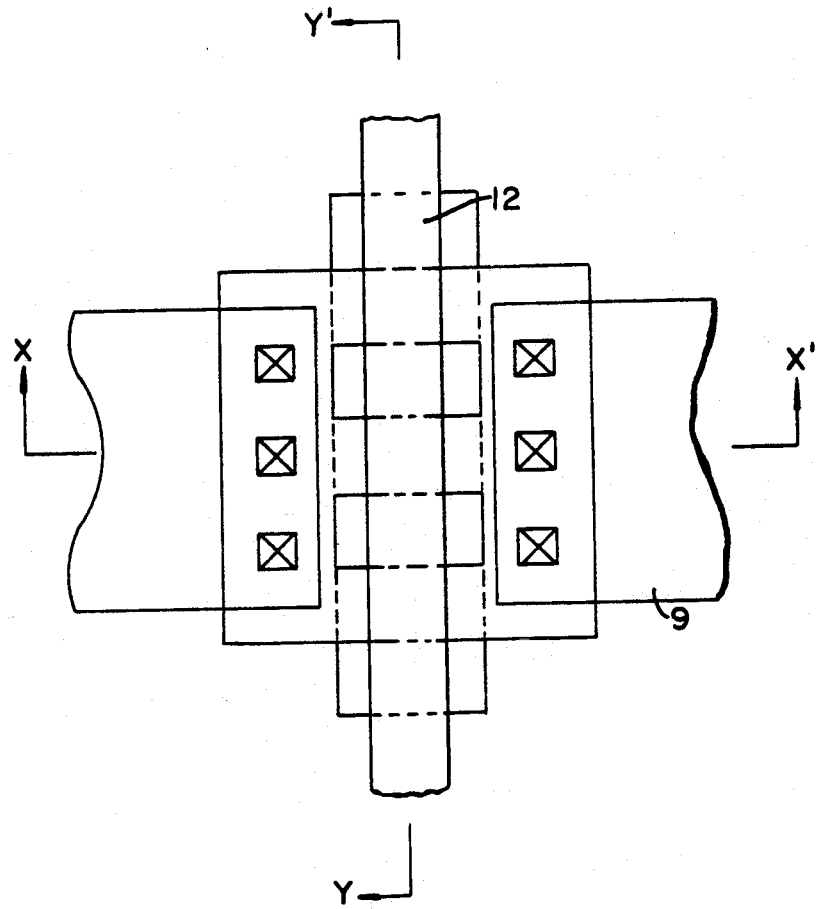
FIG. 5a is a plan view schematically indicating a structure providing common source/drain regions through parallel connection of three MISFETs.
Figure 5C:
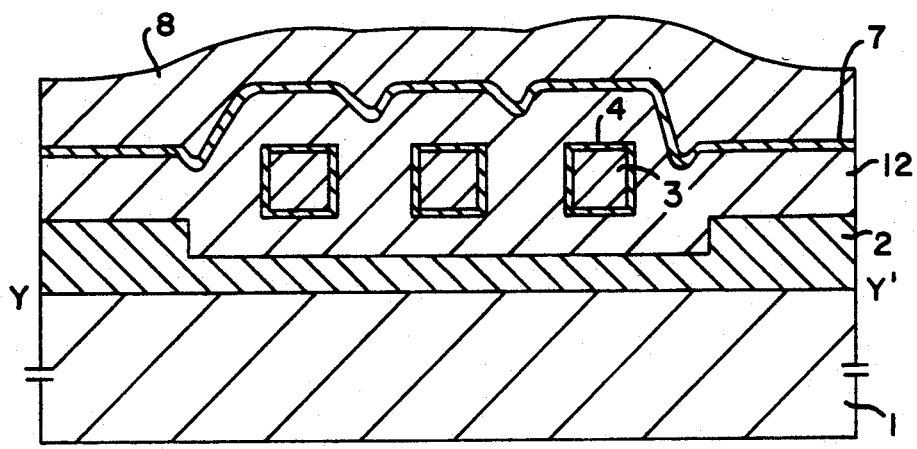

A discrete MISFET has been described, but the conductance thereof can be increased by arranging a plurality of MISFETs in parallel. FIGS. 5a, 5b, and 5c show examples of such an arrangement. In this example, three MISFETs are disposed using a common source/drain region. Thereby, an FET having a larger conductance than that of the conventional device can be obtained for the same occupied area. In this example, as shown in FIG. 5b, the gate electrode 12 does not fill the entire part of the groove width. As explained above, a part of the gate electrode material in the groove may be removed during the process, so as to form the gate electrode 12 by etching the gate electrode material.

In the embodiments of the present invention, an SOI layer formed by wafer bonding is used, but SOI layers formed by other methods, for example, dielectric isolation, epitaxial lateral overgrowth, SIMOX (separation by implanted oxygen), FIPOS (full isolation by porous silicon), SOS (silicon on sapphire), zone melting, etc. can also be used.

An N-channel transistor has been described in the above embodiments, however, a P-channel transistor is also applicable, merely by changing the dopant species. In the case of an n-type substrate, phosphorus is used for channel doping and boron ions are implanted for forming the source/drain region.

The manufacturing method for an FET using SOI, as described in the above embodiments, employs $SiO_2$ as the insulator material, however, silicon carbide or silicon nitride can be used instead of $SiO_2$ only by slight modification of the manufacturing process.

It is readily apparent that the above-described manufacturing method for semiconductor devices meets all of the objects mentioned above and also has the advantage of wide commercial utility. It should be understood that the specific form of the invention hereinabove described is intended to be representative only, as certain modifications within the scope of these teachings will be apparent to those skilled in the art.

Accordingly, reference should be made to the following claims in determining the full scope of the invention.

I claim:

1. A method for manufacturing a Metal Insulator Semiconductor Field Effect Transistor (MISFET) utilizing as a device region a semiconductor layer formed on a surface of an insulation layer, comprising the steps of:
   (a) forming a semiconductor layer island on top of said insulation layer, said semiconductor layer island having a predetermined length extending longitudinally in at least one direction;
   (b) forming a groove in said insulation layer by selectively removing a portion of said insulation layer underneath said semiconductor layer island, said groove having a longitudinal dimension extending substantially transverse to said one direction wherein a width of said groove is less than said predetermined length of said semiconductor layer island such that said semiconductor layer island extends over said groove forming a bridge thereover;
   (c) forming an insulation film over exposed surfaces of said semiconductor layer island; and
   (d) forming a gate electrode by patterning a conductive film around said semiconductor layer island, said conductive film filling said groove and covering said insulation film formed over said semiconductor layer island.

2. A method for manufacturing a Metal Insulator Semiconductor Field Effect Transistor (MISFET) on an SOI substrate, said SOI substrate comprising a first semiconductor substrate, an insulation layer on the surface of said first semiconductor substrate and a semiconductor layer on the surface of said insulation layer, comprising the steps of:
   (a) forming a semiconductor layer island on top of said insulation layer, said semiconductor layer island extending longitudinally in at least one direction;
   (b) forming a groove in said insulation layer by selectively removing a portion of said insulation layer underneath said semiconductor layer island, said groove having a longitudinal dimension extending substantially transverse to said one direction wherein a width of said groove is less than said predetermined length of said semiconductor layer island such that said semiconductor layer island extends over said groove forming a bridge thereover, a portion of said first semiconductor substrate being exposed in said groove;
   (c) forming an insulation film over exposed surfaces of said semiconductor layer island and over said portion of said first semiconductor substrate exposed in said groove;
   (d) forming a gate electrode by patterning a conductive film around said semiconductor layer island, said conductive film filling said groove and covering said insulation film formed over said semiconductor layer island.

3. A method for manufacturing a Metal Insulator Semiconductor Field Effect Transistor (MISFET) utilizing as a device region a semiconductor layer formed on a surface of an insulation layer, comprising the steps of:
   (a) forming a semiconductor layer island on top of said insulation layer, said semiconductor layer island extending longitudinally in at least one direction;
   (b) forming a groove in said insulation layer by selectively removing a portion of said insulation layer underneath said semiconductor layer island, wherein said semiconductor layer island extends over said groove forming a bridge thereover,
   (c) forming a first insulation film over exposed surfaces of said semiconductor layer island;
   (d) forming an electrode comprising a first conductive film filling said groove but not covering said semiconductor layer island;
   (e) removing exposed portions of said first insulation film, thereby exposing a top portion of said semiconductor layer island;
   (f) forming a second insulation film over an exposed surface of said first conductive film and said top portion of said semiconductor layer island;
   (g) forming a contact window through said second insulation film by selectively removing a portion of said second insulation film to expose a surface of said first conductive film; and
   (h) patterning a second conductive film around said semiconductor layer island, said second conductive film covering said second insulation film and said exposed surface of said first conductive film thereby forming an electrical connection between said first and second conductive films through said contact window.

4. A method for manufacturing a Metal Insulator Semiconductor Field Effect Transistor (MISFET) on an SOI substrate, said SOI substrate comprising a first semiconductor substrate, an insulation layer on the surface of said first semiconductor substrate and a semiconductor layer on the surface of said insulation layer, comprising the steps of:
   (a) forming a semiconductor layer island on top of said insulation layer, said semiconductor layer island extending longitudinally in at least one direction;

(b) forming a groove in said insulation layer by selectively removing a portion of said insulation layer underneath said semiconductor layer island, wherein said semiconductor layer island extends over said groove forming a bridge thereover, a portion of said first semiconductor substrate being exposed in said groove;

(c) forming a first insulation film over exposed surfaces of said semiconductor layer island and over said portion of said first semiconductor substrate exposed in said groove;

(d) forming an electrode comprising a first conductive film filling said groove;

(e) removing exposed portions of said first insulation film, thereby exposing a top portion of said semiconductor layer island;

(f) forming a second insulation film over an exposed surface of said first conductive film and said top portion of said semiconductor layer island;

(g) forming a contact window through said second insulation film by selectively removing a portion of said second insulation film to expose a surface of said first conductive film; and (h) patterning a second conductive film around said semiconductor layer island, said second conductive film covering said second insulation film and said exposed surface of said first conductive film thereby forming an electrical connection between said first and second conductive films through said contact window.

5. A method for manufacturing a MISFET according to claims 1, 2, 3 or 4, wherein said step (b) of forming a groove comprises forming a resist film over said insulator layer and said semiconductor layer island, said resist film having an etching window therein crossing said semiconductor layer island and exposing said insulation layer on either side of said semiconductor island, wherein said groove is formed by etching using an etchant.

6. A method for manufacturing a MISFET according to claim 5, wherein said etchant comprises hydrofluoric acid.

7. A method for manufacturing a MISFET according to claims 2 or 4, wherein said step (a) of forming a semiconductor layer comprises forming a uniform insulation layer over the surface of said first semiconductor substrate, bonding one side of a second semiconductor substrate with said insulation layer, and uniformly grinding a side of said second semiconductor substrate opposed to said one side.

8. A method for manufacturing a MISFET according to claim 5, wherein said step (b) of forming a groove comprises forming said groove through an area underneath said semiconductor layer by conducting the etching from both sides of a center area of said semiconductor layer island.

9. A method for manufacturing a MISFET according to claim 6, wherein said step (b) of forming a groove comprises forming said groove through an area underneath said semiconductor layer by conducting the etching from both sides of a center area of said semiconductor layer island.

10. A method for manufacturing a MISFET according to claim 1, 2, 3 or 4, wherein said conductive film and said electrode comprise impurity doped polysilicon.

11. A method for manufacturing a MISFET according to claim 1, 2, 3 or 4, wherein said conductive film filling said groove comprises impurity doped polysilicon deposited in said groove by chemical vapor deposition (CVD).

12. A method for manufacturing a MISFET according to claim 5, wherein etching of said insulation layer is carried out to a depth such that the semiconductor substrate is not exposed.

13. A method for manufacturing a MISFET according to claims 1, 2, 3 or 4, wherein said step (c) of forming an insulation film comprises forming said insulation film by thermal oxidation in a water vapor free atmosphere.

14. A method for manufacturing a MISFET according to claims 1, 2, 3 or 4, wherein said step (a) of forming a semiconductor layer island comprises forming a plurality of semiconductor layer islands wherein each of said semiconductor layer islands forms a MISFET, thereby providing a plurality of MISFETs having common source and drain regions.

15. A method for manufacturing a MISFET according to claims 1, 2, 3 or 4, further comprising, after said step (d), removing by etching a portion of said conductive film filling said groove.

16. A method for manufacturing a MISFET according to claims 1, 2, 3, or 4 wherein said semiconductor layer island is formed in the shape of a rectangle, and further comprising, after said step (b) of forming a groove, a step of rounding the corners of said rectangle by one of isotropic etching or rounding oxidation.

* * * * *